United States Patent
Masuoka et al.

(10) Patent No.: US 8,324,090 B2
(45) Date of Patent: Dec. 4, 2012

(54) METHOD TO IMPROVE DIELECTRIC QUALITY IN HIGH-K METAL GATE TECHNOLOGY

(75) Inventors: Yuri Masuoka, Jhubei (TW); Peng-Fu Hsu, Hsinchu (TW); Huan-Tsung Huang, Hsinchu County (TW); Kuo-Tai Huang, Hsinchu (TW); Yong-Tian Hou, Singapore (SG); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 391 days.

(21) Appl. No.: 12/338,787

(22) Filed: Dec. 18, 2008

(65) Prior Publication Data
US 2010/0052063 A1    Mar. 4, 2010

Related U.S. Application Data

(60) Provisional application No. 61/092,616, filed on Aug. 28, 2008.

(51) Int. Cl.
*H01L 21/4763* (2006.01)
*H01L 25/11* (2006.01)
*H01L 29/78* (2006.01)

(52) U.S. Cl. ............... 438/591; 257/369; 257/E21.496; 257/E25.024; 257/E29.255

(58) Field of Classification Search ............ 257/369, 257/E21.496, E25.024, E29.255; 438/591
See application file for complete search history.

(56) References Cited

U.S. PATENT DOCUMENTS

| | | | |
|---|---|---|---|
| 6,750,519 B2 | 6/2004 | Lin et al. | |
| 6,830,998 B1 * | 12/2004 | Pan et al. | 438/592 |
| 7,005,716 B2 | 2/2006 | Lin et al. | |
| 7,019,351 B2 * | 3/2006 | Eppich et al. | 257/303 |
| 7,071,086 B2 | 7/2006 | Woo et al. | |
| 7,547,951 B2 * | 6/2009 | Lim et al. | 257/410 |
| 2009/0008725 A1 * | 1/2009 | Guha et al. | 257/411 |
| 2009/0039435 A1 * | 2/2009 | Doris et al. | 257/369 |

FOREIGN PATENT DOCUMENTS

CN    1992273    7/2007

OTHER PUBLICATIONS

Chinese Patent Office, Office Action dated Aug. 6, 2010, Application No. 200910159771.4, 3 pages.

* cited by examiner

*Primary Examiner* — Calvin Lee
*Assistant Examiner* — Monica D Harrison
(74) *Attorney, Agent, or Firm* — Haynes and Boone, LLP

(57) ABSTRACT

The present disclosure provides a method of fabricating a semiconductor device. The method includes providing a semiconductor substrate having a first active region and a second active region, providing a semiconductor substrate having a first region and a second region, forming a high-k dielectric layer over the semiconductor substrate, forming a first capping layer and a second capping layer over the high-k dielectric layer, the first capping layer overlying the first region and the second capping layer overlying the second region, forming a layer containing silicon (Si) over the first and second capping layers, forming a metal layer over the layer containing Si, and forming a first gate stack over the first region and a second gate stack over the second active region. The first gate stack includes the high-k dielectric layer, the first capping layer, the layer containing Si, and the metal layer and the second gate stack includes the high-k dielectric layer, the second capping layer, the layer containing Si, and the metal layer.

21 Claims, 20 Drawing Sheets

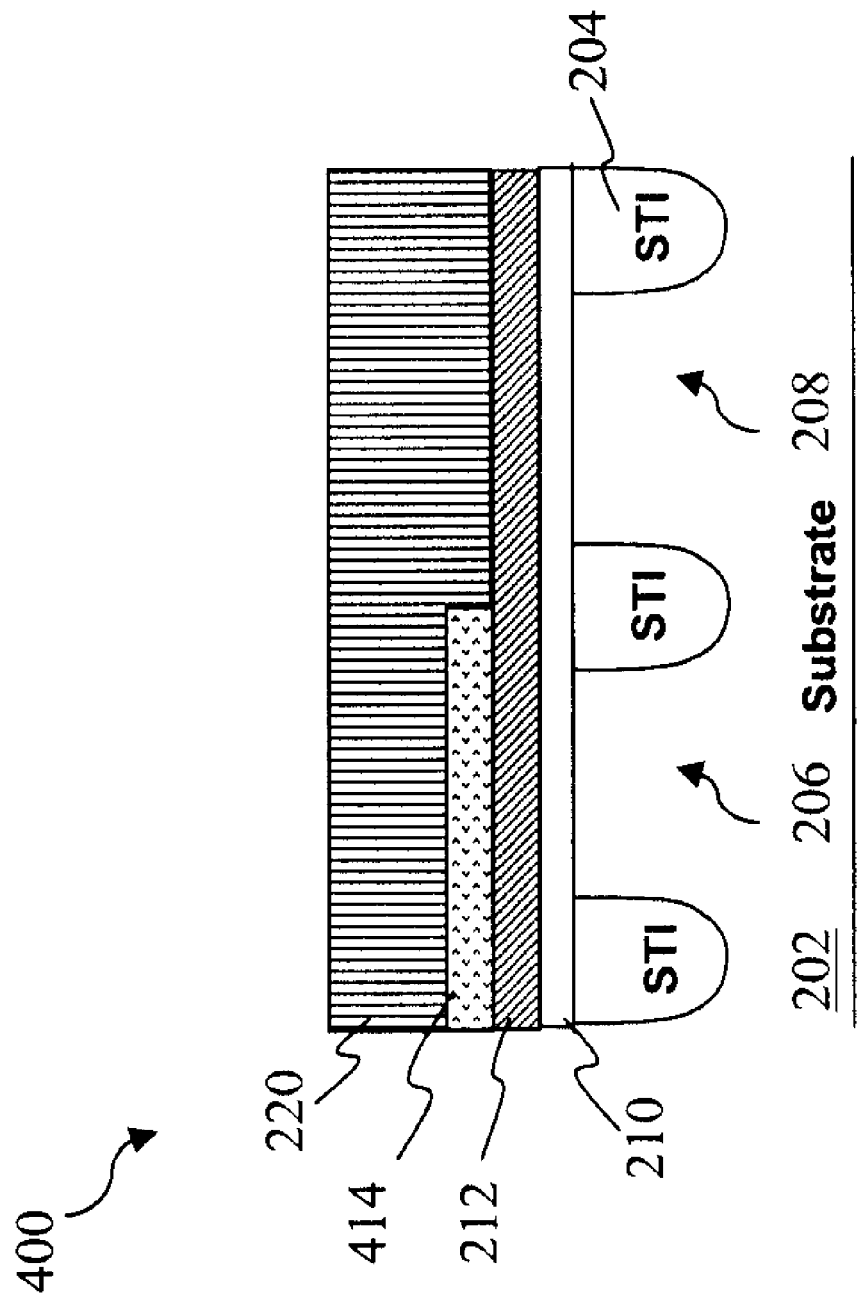

METHOD TO IMPROVE DIELECTRIC QUALITY IN HIGH-K METAL GATE TECHNOLOGY

PRIORITY DATA

This application claims priority to U.S. Provisional Application Ser. No. 61/092,616, filed on Aug. 28, 2008, entitled "METHOD TO IMPROVE DIELECTRIC QUALITY IN HIGH-K METAL GATE TECHNOLOGY," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, problems arise when integrating a high-k/metal gate feature in a CMOS process flow due to various factors such as incompatibility of materials, complex processes, and thermal budgets. For example, one of the issues for high-k gate dielectric is its lower thermal stability. Accordingly, a quality of the high-k gate dielectric may change during a thermal process cycle and surrounding environment of the CMOS process flow, and thus may result in poor device performance and reliability.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4A to 4E are cross-sectional views of a semiconductor device at various stages of fabrication according to the method of FIG. 3;

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
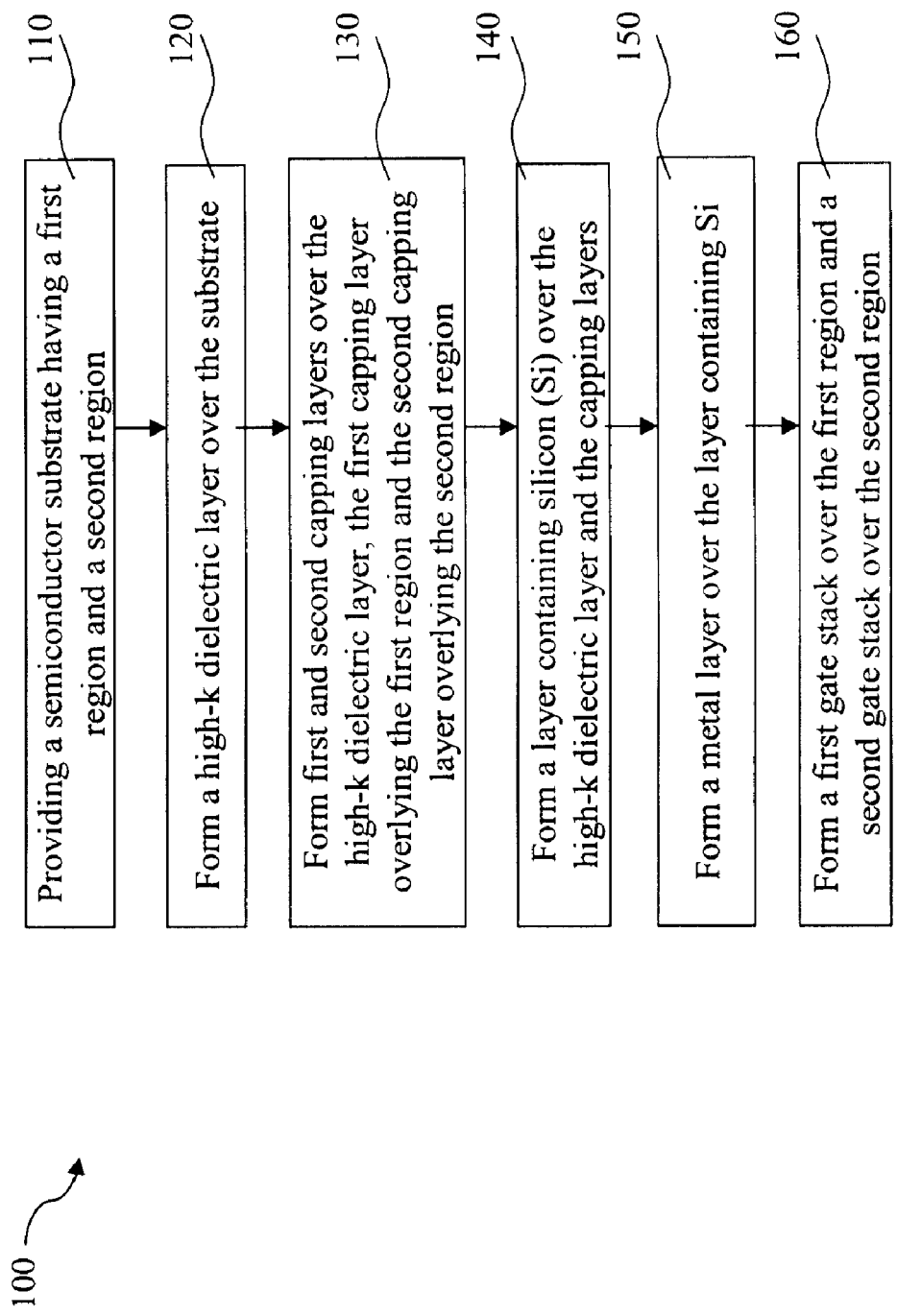
FIG. 1 is a flowchart of a method for fabricating a semiconductor device having a high-k dielectric and metal gate according to various aspects of the present disclosure.

Referring to FIG. 1, illustrated is a flowchart of a method 100 for fabricating a semiconductor device having a high-k dielectric and metal gate according to various aspects of the present disclosure. Referring also to FIGS. 2A to 2F, illustrated are cross-sectional views of a semiconductor device 100 at various stages of fabrication according to the method 100 of FIG. 1. FIGS. 2A to 2F have been simplified to emphasize gate structures of an n-type MOS (NMOS) device and p-type MOS (PMOS) device, respectively, for a better understanding of the inventive concepts of the present embodiment.

The method 100 begins with block 110 in which a semiconductor substrate having a first region and a second region may be provided. In FIG. 2A, the semiconductor device 200 may include a semiconductor substrate 202 such as a silicon substrate. The substrate 202 may alternatively include silicon germanium, gallium arsenic, or other suitable semiconductor materials. The substrate 202 may further include other features such as various doped regions such as a p-well or n-well, a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 200 may further include an isolation structure 204 such as a shallow trench isolation (STI) feature formed in the substrate 202 for isolating active regions 206 and 208 in the substrate. The isolation structure 204 may be formed of silicon oxide, silicon nitride, silicon oxynitride, fluoride-doped silicate (FSG), and/or a low k dielectric material known in the art. The active region 206 may be configured as an NMOS transistor device and the active region 208 may be configured as a PMOS transistor device.

The semiconductor device 200 may further include an interfacial layer 210 formed on the substrate 202. The interfacial layer 210 may include a silicon oxide layer having a thickness ranging from about 5 to about 10 angstrom (A). The method 100 continues with block 120 in which a high-k dielectric layer may be formed over the substrate. The semiconductor device 200 may further include a high-k dielectric layer 212 formed on the interfacial layer 210. The high-k dielectric layer 212 may be formed by atomic layer deposition (ALD), chemical vapor deposition (CVD), physical vapor deposition (PVD or sputtering), or other suitable technique. The high-k dielectric layer 212 may include a thickness ranging from about 10 to about 30 angstrom (A). The high-k dielectric layer 212 may include hafnium oxide ($HfO_2$). Alternatively, the high-k dielectric layer 212 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

The method 100 continues with block 130 in which a first capping layer and a second capping layer may be formed over the high-k dielectric layer, the first capping layer overlying the first region and the second capping layer overlying the second region. The semiconductor device 200 may further include capping layers for tuning a work function (for the gate electrode) for properly performing as an NMOS device 206 and a PMOS device 208, respectively. For example, a capping layer 214 such as lanthanum oxide ($LaO_x$) may be formed in the NMOS device 206 side. Alternatively, the capping layer 214 may optionally include an oxide containing Dy, Sc, Yb, Er, or Gd. The capping layer 214 may include a thickness ranging from about 3 to about 20 angstrom (A).

Figure 2B:
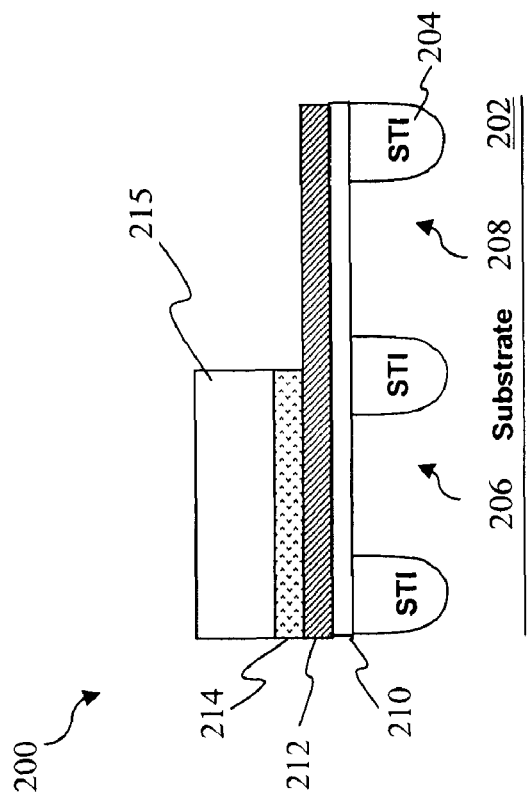
FIGS. 2A to 2F are a cross-sectional view of a semiconductor at various stages of fabrication according to the method of FIG. 1.
Figure 2A:
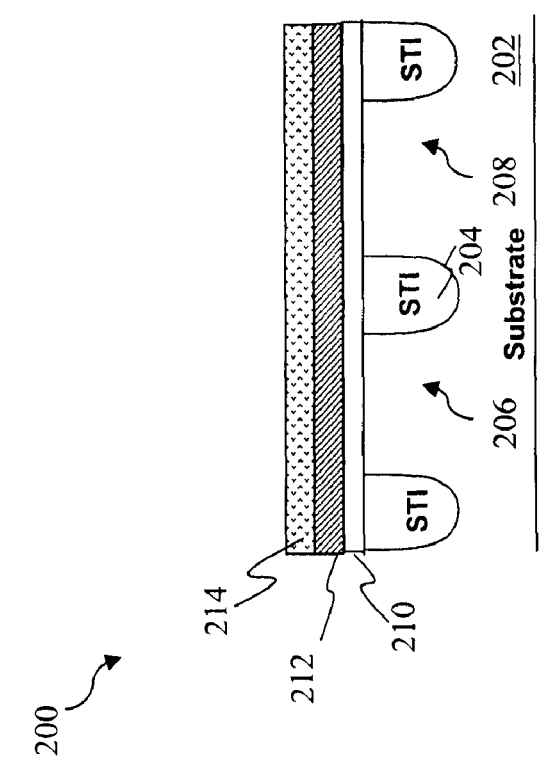

In FIG. 2B, the capping layer 214 may be removed in the PMOS device 208 side by forming a patterned photoresist 215 to protect the capping layer 214 in the NMOS device 206 side, and then performing a wet etching or dry etching or combination dry and wet etching process to remove the unprotected capping layer 214. For example, the patterned photoresist 215 may be formed by a photolithography process. An exemplary photolithography process may include photoresist coating, soft baking, mask aligning, exposing, post-exposure baking, developing photoresist, and hard baking. The photolithography exposing process may also be implemented by other suitable methods such as maskless photolithography, electron-beam writing, ion-beam writing, and molecular imprinting. Alternatively, a hard mask may optionally be used to protect the capping layer 214 in the NMOS device 206 side instead of the photoresist 215. The etching process may use diluted hydrochloride (HCl) solution or sulfuric acid ($H_2SO_4$) or other suitable etchant to remove the capping layer. After the etching process, the patterned photoresist 215 may be removed by a stripping process or other suitable process.

Figure 2C:
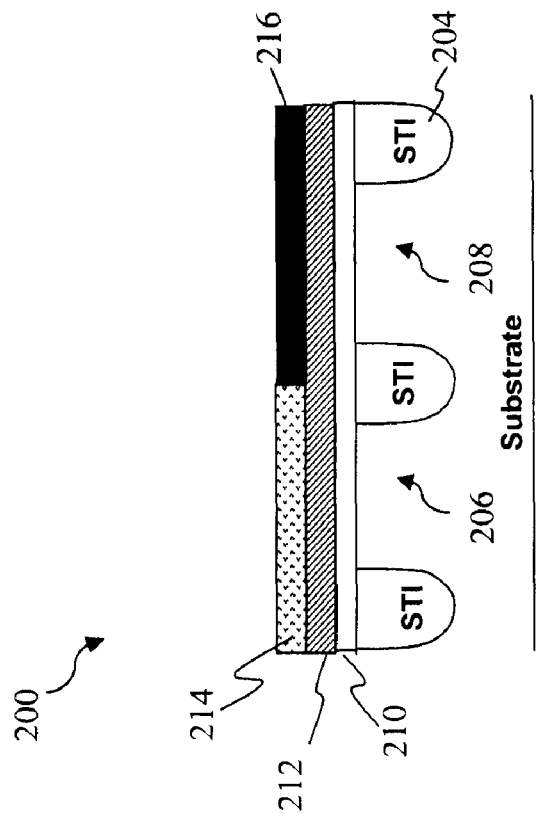
Figure 2D:
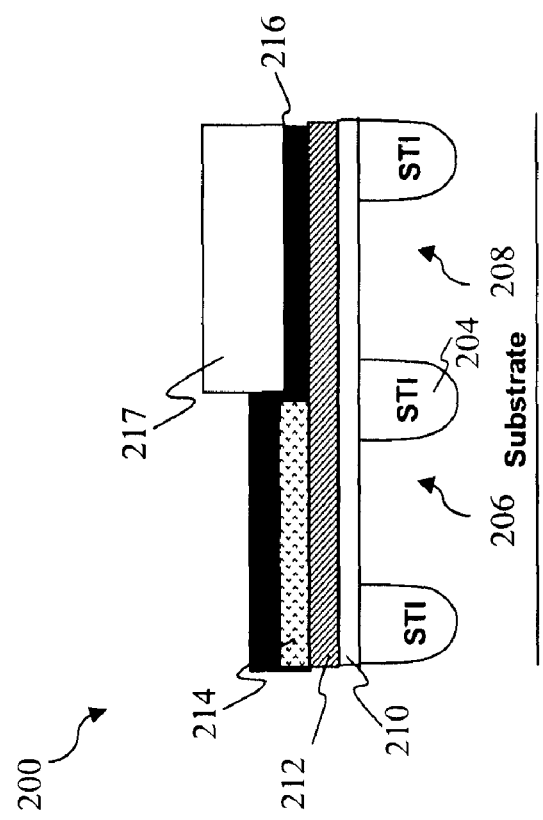

A capping layer 216 such as aluminum oxide ($Al_2O_3$) may be formed in the PMOS device 208 side. In FIG. 2C, the capping layer 216 may be formed over the capping layer 214 in the NMOS device side 206 and over the high-k dielectric 212 in the PMOS device side 208. The capping layer 216 may include a thickness ranging from about 3 to about 20 angstrom (A). The capping layer 216 may be removed in the NMOS device 206 side by forming a patterned photoresist 217 to protect the capping layer 216 in the PMOS device 208 side, and then performing a wet etching or dry etching or combination dry and wet etching process to remove the unprotected capping layer 216. Alternatively, a hard mask may optionally be used to protect the capping layer 216 in the PMOS device 208 side instead of the photoresist 217. In FIG. 2D, the photoresist 217 may be removed by a stripping process or other suitable process. Accordingly, the capping layer 216 remains in the PMOS device 208 side. Alternatively, the capping layer 216 may optionally include an oxide containing titanium (Ti). It should be noted that the high-k dielectric 212 and capping layers 214, 216 disclosed above are mere examples and that other configurations may also be used. In some embodiments, the capping layers 214, 216 may be omitted.

Figure 2F:
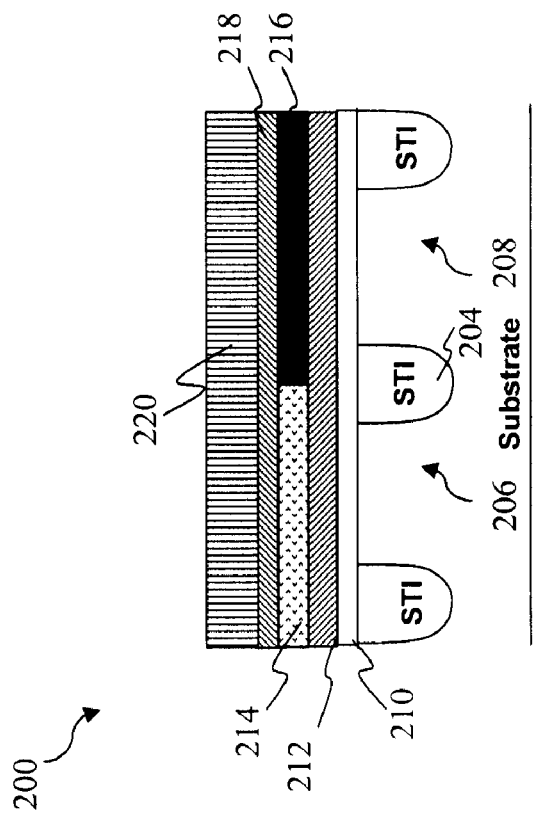
Figure 2E:
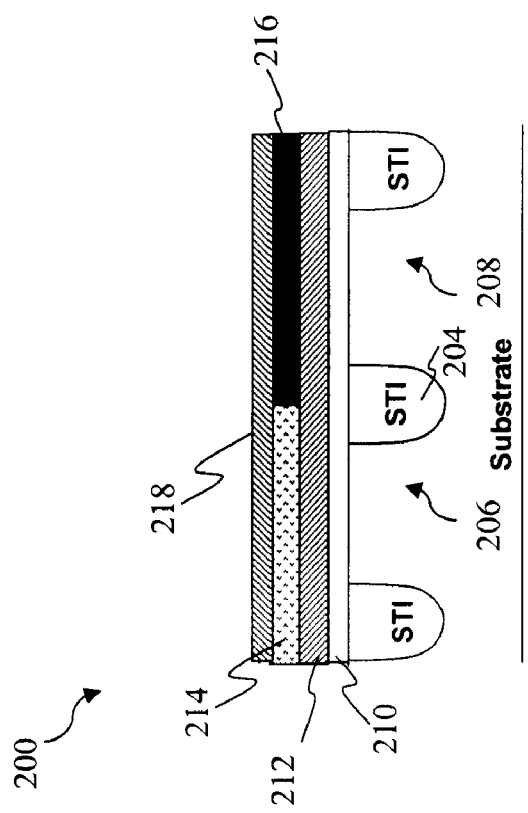

The method 100 continues with block 140 in which a layer containing silicon (Si) may be formed over the high-k dielectric layer and capping layers. In FIG. 2E, the semiconductor device 200 may include a thin layer containing silicon (Si) 218 formed over the high-k dielectric layer 212 and the capping layers 214, 216. The thin layer containing Si 218 may include a silicon layer. Alternatively, the thin layer containing Si 218 may optionally include silicon oxide. Further, the layer containing Si 218 may also include a Si-rich silicon oxide. The thin layer containing Si 218 may be formed by ALD, PVD, in-situ $O_2$, or other oxidation process. The thin layer containing Si 218 may have a thickness that is less than about 5 angstrom (A).

The method 100 continues with block 150 in which a metal layer may be formed over the layer containing Si. In FIG. 2F, the semiconductor device 200 may further include a metal layer 220 formed over the layer containing Si 218. The metal layer 220 may include any metal material suitable for forming a metal gate or portion thereof, including work function layers, liner layers, interface layers, seed layers, adhesion layers, barrier layers, etc. The metal layer 220 may include various metals such as TiN, TiAlN, TaN, TaC, WN, Al, or other suitable metals. The metal layer 220 may have a thickness ranging from 20 to about 200 angstrom (A). The metal layer 220 may be formed by various deposition techniques such as CVD, PVD or sputtering, plating, or other suitable technique.

The method 100 continues with block 160 in which a first gate stack may be formed over the first region and a second gate stack may be formed over the second region. The semiconductor device 200 may further include a polysilicon (or poly) layer formed over the metal layer 220 by a suitable deposition process. The poly layer may include a thickness ranging from about 400 to about 800 angstrom (A). The semiconductor device 200 may optionally include a hard mask layer, such as silicon nitride or silicon oxynitride, formed on the poly layer. The hard mask layer may include a thickness ranging from about 100 to about 400 angstrom (A). Further, the semiconductor device 200 may include an antireflective coating layer or bottom antireflective coating (BARC) layer to enhance a photolithography process for patterning a photoresist layer.

For example, a patterned photoresist layer may be formed on the hard mask layer including a gate pattern overlying the NMOS device 206 side and a gate pattern overlying the PMOS region 208 side. The gate patterns may be used to pattern the hard mask layer by a dry or wet etch process. The patterned hard mask may be used to form a gate stack in the NMOS device 206 side and a gate stack in the PMOS region 208 side by a dry etch process, wet etch process, or combination dry and wet etch process. It is understood the semiconductor device 200 may continue with a CMOS process flow to form various structures and features such as lightly doped source/drain regions (LDD), sidewall spacers on the gate stacks, source/drain regions, silicide features, contact etch stop layers (CESL), inter-layer dielectric (ILD), contact/vias, interconnect layers, metal layers, dielectric layers, passivation layer and so forth.

It should be noted that during the subsequent CMOS process flow, the Si in the layer containing Si 218 between the high-k dielectric layer 212 and metal gate layer 220 may diffuse such that Si may be present within 5 angstrom (A) from the high-k dielectric layer 212/metal gate layer 220 interface. It has been observed that by incorporating Si between the high-k dielectric layer 212 and metal gate layer 220 (after high-k dielectric deposition and prior to metal gate layer deposition), the dimension dependence of various performance characteristics may be reduced. In other words, there is less dimension dependence (e.g., gate length and width) for transistor performance including threshold voltage, drive-current, off-current. Also, thermal stability of the high-k dielectric layer 212 may be improved in the above embodiment, and thus carrier mobility and reliability may be improved. Additionally, there may be negligible threshold/capacitance change by inserting the Si containing layer 218 under the metal gate layer 220. Further, although the example above was disclosed as being fabricated in a gate first process, the Si containing layer may be implemented in a gate last process and also a hybrid process that includes a gate first process and a gate last process.

Figure 3:
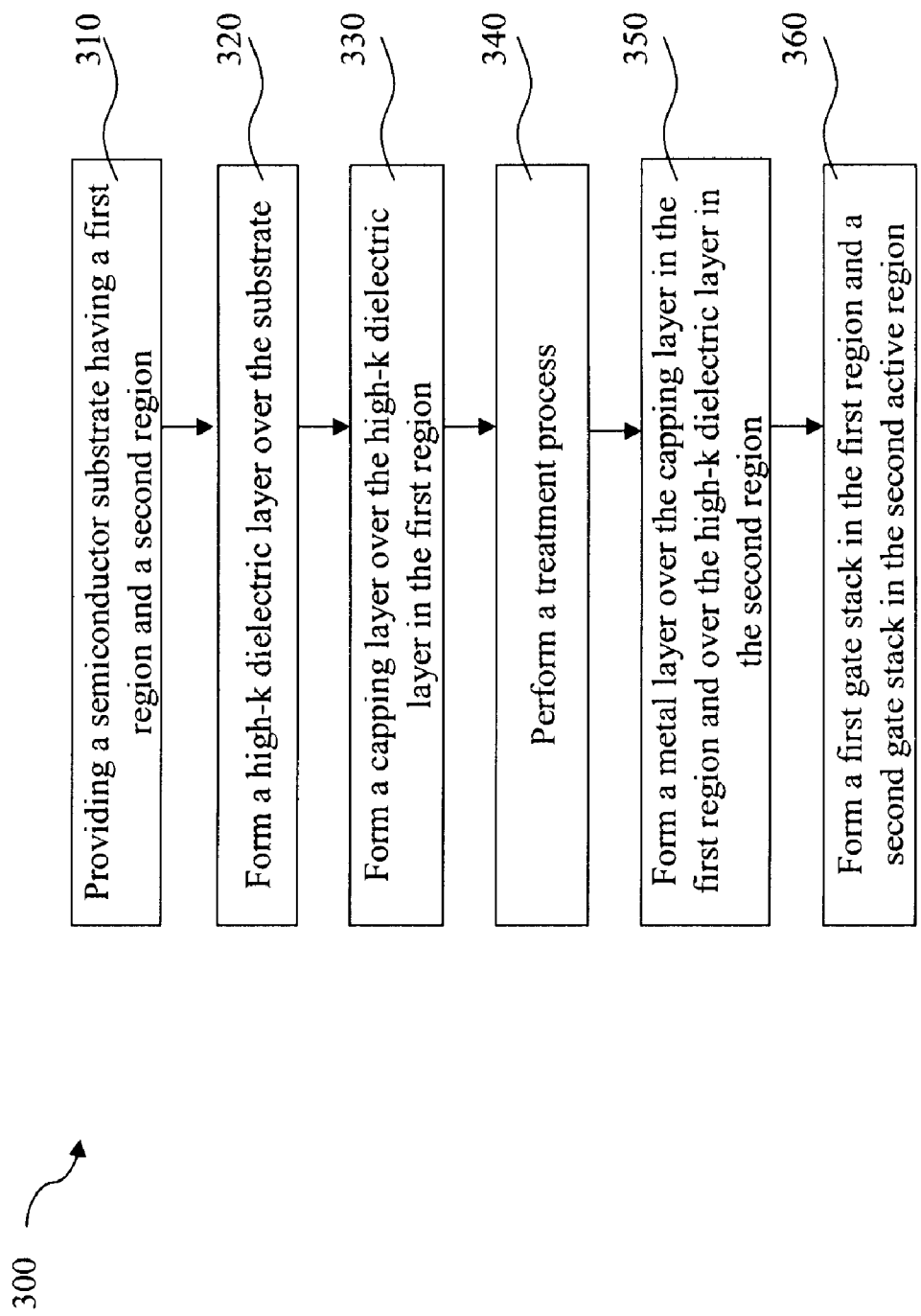
FIG. 3 is a flowchart of an alternative method for fabricating a semiconductor device having a high-k dielectric and metal gate according to various aspects of the present disclosure.
Figures 4A, 4B:
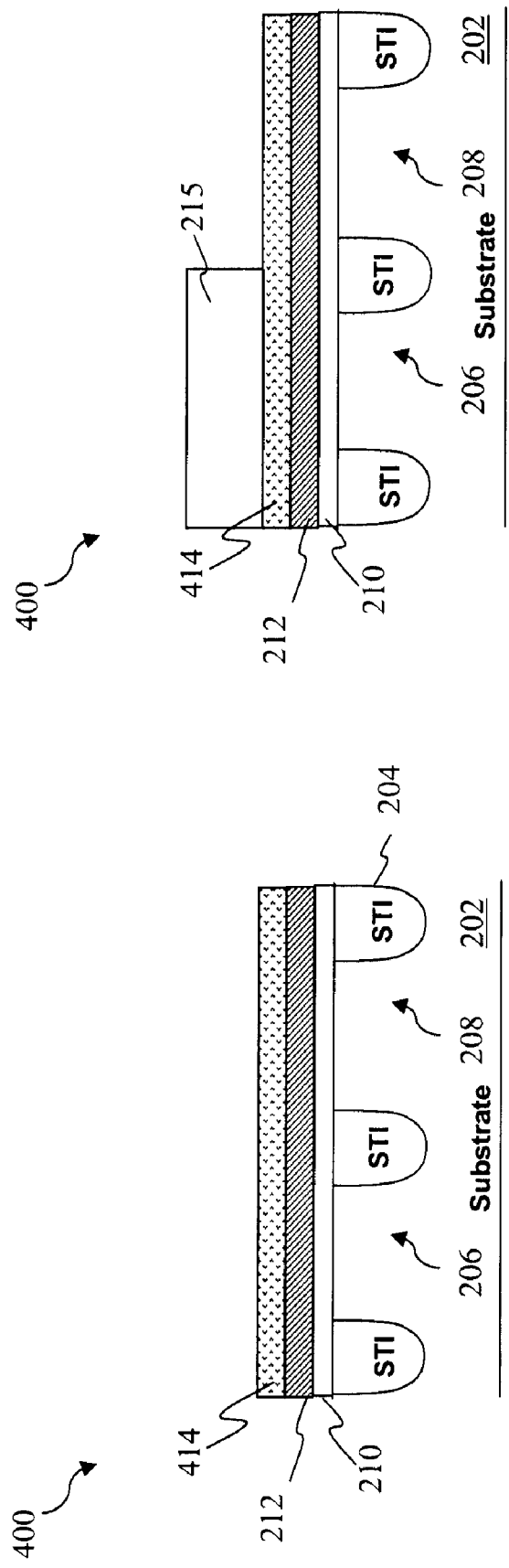
Figure 4D:
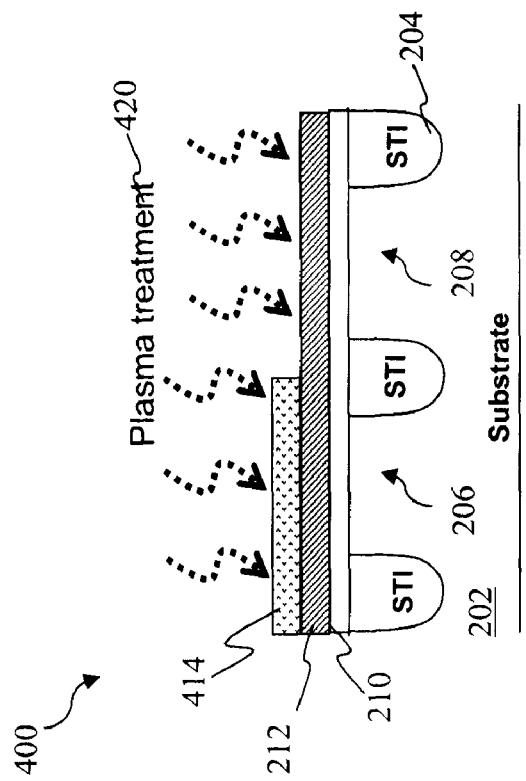
Figure 4C:
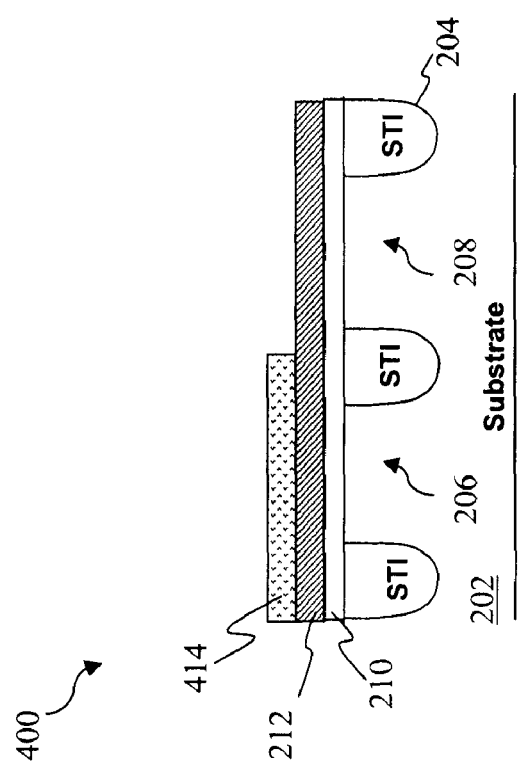

Referring to FIG. 3, illustrated is a flowchart of an alternative method 300 for fabricating a semiconductor device having a high-k dielectric and metal gate according to various aspects of the present disclosure. Referring also to FIGS. 4A to 4E, illustrated are cross-sectional views of a semiconductor device 400 at various stages of fabrication according to the method 300 of FIG. 3. FIGS. 4A to 4E have been simplified to emphasize gate structures of an NMOS device and PMOS device, respectively, for a better understanding of the inventive concepts of the present embodiment. The semiconductor device 400 may be similar to the semiconductor device 200 of FIG. 2. Similar features in FIGS. 2 and 4 are numbered the same for the sake of simplicity and clarity.

The method 300 begins with block 310 in which a semiconductor substrate having a first region and a second region may be provided. In FIG. 4A, the semiconductor device 400 may include a semiconductor substrate 202 such as a silicon substrate. The substrate 202 may alternatively include silicon germanium, gallium arsenic, or other suitable semiconductor materials. The substrate 202 may further include other features such as various doped regions such as a p-well or n-well, a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 400 may further include an isolation structure 204 such as a shallow trench isolation (STI) feature formed in the substrate 202 for isolating active regions 206 and 208 in the substrate. The isolation structure 204 may be formed of silicon oxide, silicon nitride, silicon oxynitride, fluoride-doped silicate (FSG), and/or a low k dielectric material known in the art. The active region 206 may be configured as an NMOS transistor device and the active region 208 may be configured as a PMOS transistor device.

The semiconductor device 400 may further include an interfacial layer 210 formed on the substrate 202. The interfacial layer 210 may include a silicon oxide layer having a thickness ranging from about 5 to about 10 angstrom (A). The method 300 continues with block 320 in which a high-k dielectric layer may be formed over the substrate. The semiconductor device 200 may further include a high-k dielectric layer 212 formed on the interfacial layer 210. The high-k dielectric layer 212 may be formed by ALD, CVD, PVD, or other suitable technique. The high-k dielectric layer 212 may include a thickness ranging from about 10 to about 30 angstrom (A). The high-k dielectric layer 212 may include hafnium oxide ($HfO_2$). Alternatively, the high-k dielectric layer 212 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

The method 300 continues with block 330 in which a capping layer may be formed over the high-k dielectric layer in the first region. The semiconductor device 400 may further include a capping layer for tuning a work function (for the gate electrode) for properly performing as an NMOS device 206 and a PMOS device 208, respectively. For example, a capping layer 414 such as lanthanum oxide ($LaO_x$) may be formed in the NMOS device 206. Alternatively, the capping layer 414 may optionally include an oxide containing Dy, Sc, Yb, Er, or Gd. The capping layer 414 may include a thickness ranging from about 3 to about 20 angstrom (A). In FIG. 4B, the capping layer 414 may be patterned by a photolithography process and etching process to remove the capping layer 414 in the PMOS device 208. A patterned photoresist 215 may be formed on a portion of the capping layer 414, and an etching process may be performed to remove the unprotected capping layer 414 as was similarly discussed above. It is understood that a capping layer such as aluminum oxide or titanium oxide may be formed in the PMOS device 208 instead of the NMOS device 206 by a similar process. In FIG. 4C, the photoresist 215 may be removed by a stripping process or other suitable process. Accordingly, the capping layer 414 remains in the NMOS device 206 side.

The method 300 continues with block 340 in which a treatment process may be performed. In FIG. 4D, the treatment process 420 may be performed on the patterned capping layer 414. The treatment process 420 may include a plasma process with $O_3$, He, $NH_3$, $H_2$, or $N_2$. The plasma process may include the following process conditions: total pressure ranging from about 1 to about 5 torr (preferably 2 torr), partial pressure ranging from about 0.2 to about 1 torr (preferably 0.5 torr), time period ranging from about 1 to about 10 seconds (preferably 5 seconds), temperature less than about 400 degree C. (preferably 350 degree C.). Alternatively, the treatment process 420 may optionally include a low temperature (less than 400 degree C.) annealing with a gas including $H_2O$, $O_3$, He, $NH_3$, $H_2$, $N_2$, or $SiH_4$.

The method 300 continues with block 350 in which a metal layer may be formed over the capping layer in the first region and over the high-k dielectric layer in the second region. In FIG. 4C, the semiconductor device 400 may further include a metal layer 220 formed over the capping layer 414 in the NMOS device 206 side and over the high-k dielectric layer 212 in the PMOS device 208 side. The metal layer 220 may include any metal material suitable for forming a metal gate or portion thereof, including work function layers, liner layers, interface layers, seed layers, adhesion layers, barrier layers, etc. The metal layer 220 may include various metals such as TiN, TiAlN, TaN, TaC, WN, Al, or other suitable metals. The metal layer 220 may have a thickness ranging from 20 to about 200 angstrom (A). The metal layer 220 may be formed by various deposition techniques such as CVD, PVD or sputtering, plating, or other suitable technique.

The method 300 continues with block 360 in which a first gate stack may be formed in a first region and a second gate stack may be formed in the second region. The process implemented for block 360 is similar to the process discussed in block 160 of FIG. 1. Thereafter, it is understood the semiconductor device 400 may continue with CMOS process flow to form various structures such as lightly doped drain regions (LDD), sidewall spacers on the gate stacks, source/drain regions, silicide features, contact etch stop layers (CESL), inter-layer dielectric (ILD), contact/vias, interconnect layers, metal layers, dielectric layers, passivation layer and so forth. Although the example above was disclosed as being fabricated in a gate first process, the Si containing layer may be implemented in a gate last process and also a hybrid process that includes a gate first process and a gate last process. Also, it should be noted that the treatment process 420 (discussed in block 340) before the metal deposition may repair the damage caused by the patterning process of the capping layer 414. Accordingly, the dimension dependence of various performance characteristics may be reduced and the gate-capacitance may not worsen.

Figure 5:
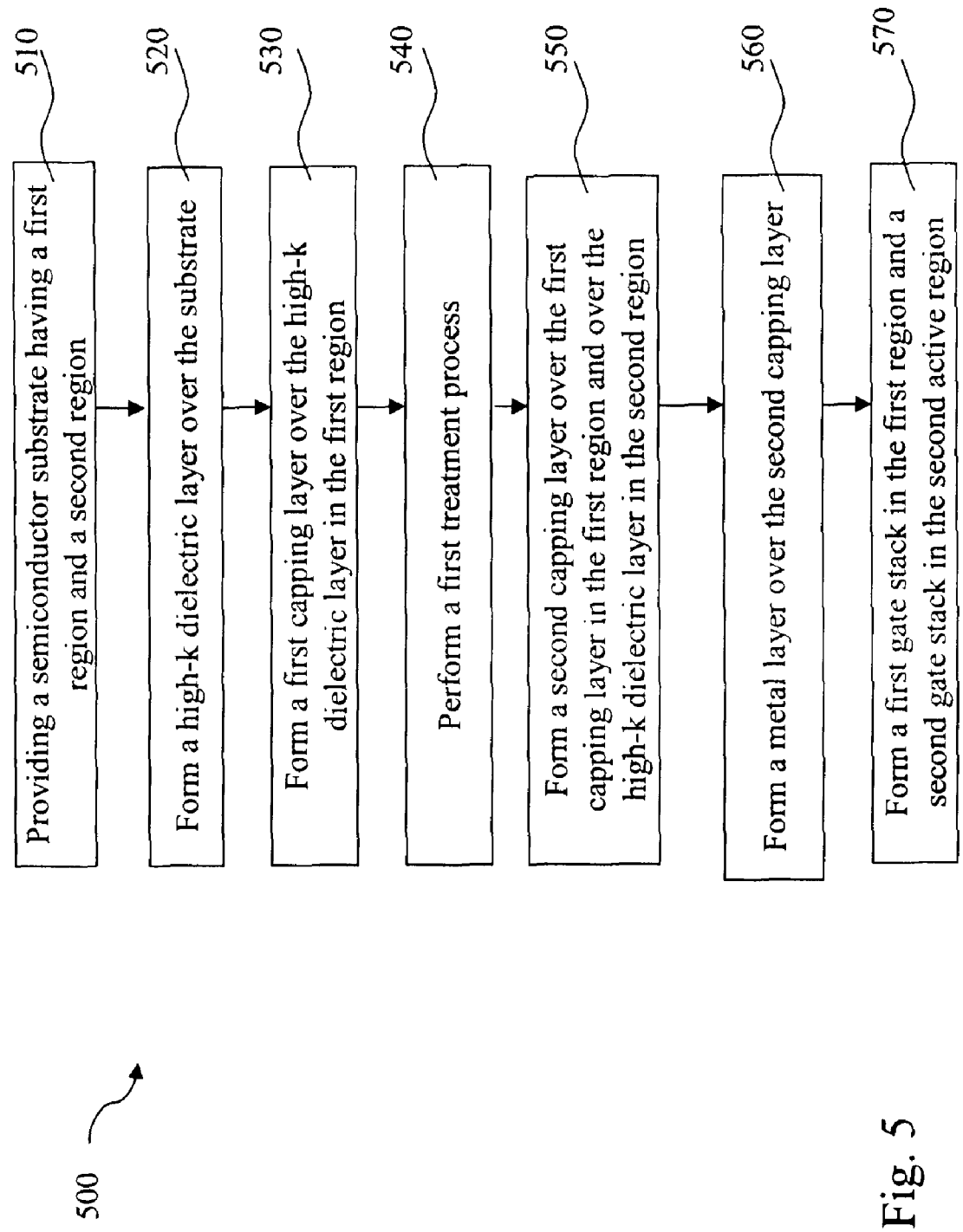
FIG. 5 is a flowchart of another alternative method for fabricating a semiconductor device having a high-k dielectric and metal gate according to various aspects of the present disclosure.

Referring to FIG. 5, illustrated is a flowchart of another alternative method 500 for fabricating a semiconductor device having a high-k dielectric and metal gate according to various aspects of the present disclosure. Referring also to FIGS. 6A to 6F, illustrated are cross-sectional views of a semiconductor device 600 at various stages of fabrication according to the method 500 of FIG. 5. FIGS. 6A to 6F have been simplified to emphasize gate structures of an NMOS device and PMOS device, respectively, for a better understanding of the inventive concepts of the present embodiment. The semiconductor device 600 may be similar to the semiconductor device 200 of FIG. 2. Accordingly, similar features in FIGS. 2 and 6 are numbered the same for the sake of simplicity and clarity.

Figures 6A, 6B:
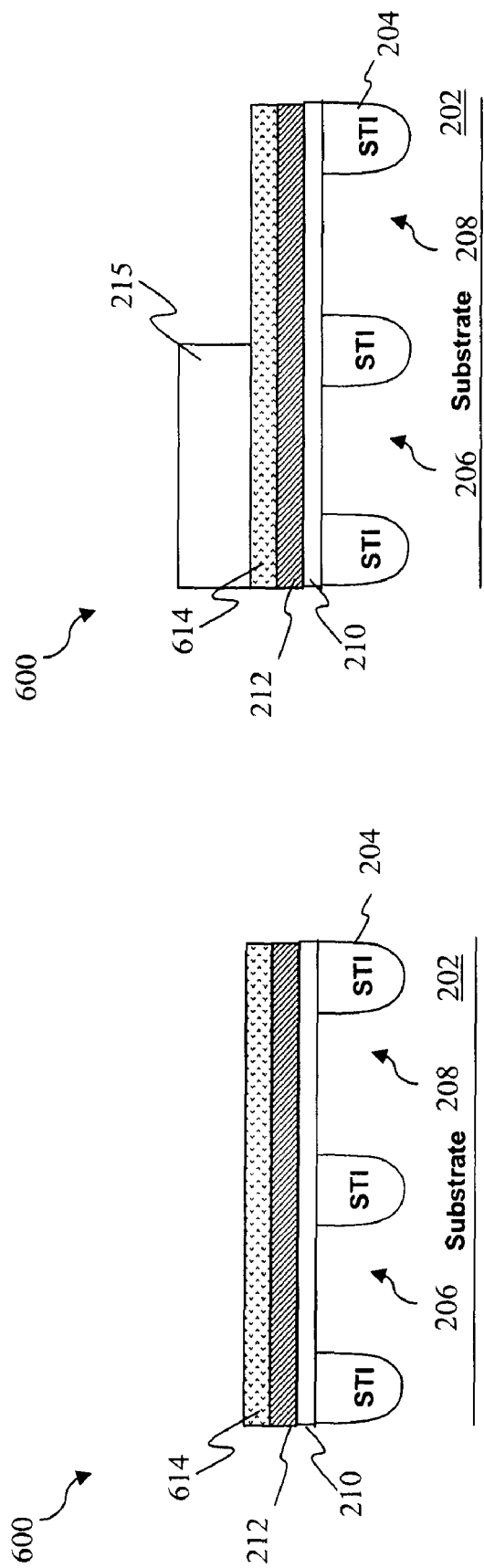
FIGS. 6A to 6F are cross-sectional views of a semiconductor at various stages of fabrication according to the method of FIG. 5.

The method 500 begins with block 510 in which a semiconductor substrate having a first region and a second region may be provided. In FIG. 6A, the semiconductor device 600 may include a semiconductor substrate 202 such as a silicon substrate. The substrate 202 may alternatively include silicon germanium, gallium arsenic, or other suitable semiconductor materials. The substrate 202 may further include other features such as various doped regions such as a p-well or n-well, a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 600 may further include an isolation structure 204 such as a shallow trench isolation (STI) feature formed in the substrate 202 for isolating active regions 206 and 208 in the substrate. The isolation structure 204 may be formed of silicon oxide, silicon nitride, silicon oxynitride, fluoride-doped silicate (FSG), and/or a low k dielectric material known in the art. The active region 206 may be configured as an NMOS transistor device and the active region 208 may be configured as a PMOS transistor device.

The semiconductor device 600 may further include an interfacial layer 210 formed on the substrate 202. The interfacial layer 210 may include a silicon oxide layer having a thickness ranging from about 5 to about 10 angstrom (A). The method 500 continues with block 520 in which a high-k dielectric layer may be formed over the substrate. The semiconductor device 600 may further include a high-k dielectric layer 212 formed on the interfacial layer 210. The high-k dielectric layer 212 may be formed by ALD, CVD, PVD, or other suitable technique. The high-k dielectric layer 212 may include a thickness ranging from about 10 to about 30 angstrom (A). The high-k dielectric layer 212 may include hafnium oxide ($HfO_2$). Alternatively, the high-k dielectric layer 212 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

Figure 6D:
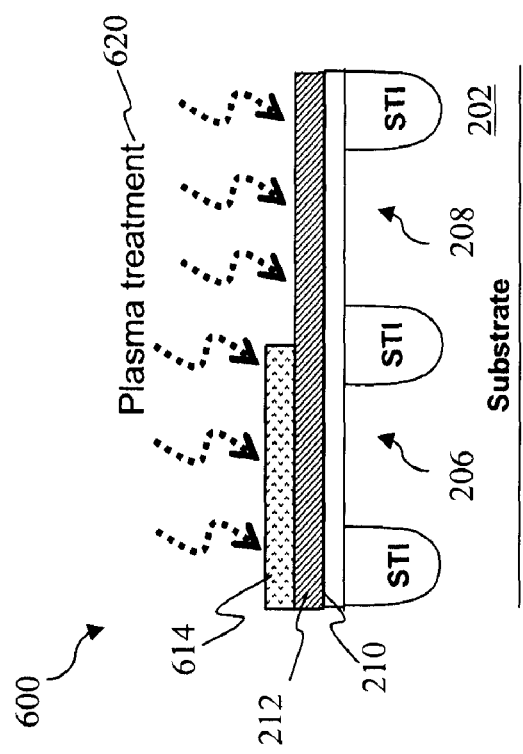
Figure 6C:
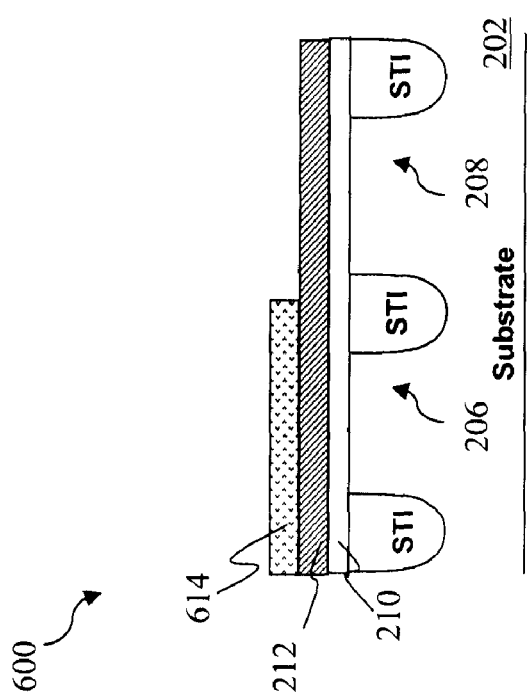

The method 500 continues with block 530 in which a first capping layer may be formed over the high-k dielectric layer in the first region. The semiconductor device 600 may further include a capping layer for tuning a work function (for the gate electrode) for properly performing as an NMOS device 206. For example, a capping layer 614 such as lanthanum oxide ($LaO_x$) may be formed in the NMOS device 206. Alternatively, the capping layer 614 may optionally include an oxide containing Dy, Sc, Yb, Er, or Gd. The capping layer 614 may include a thickness ranging from about 3 to about 20 angstrom (A). In FIG. 6B, the capping layer 614 may be patterned by a photolithography process and etching process to remove the capping layer 614 in the PMOS device 208. For example, a patterned photoresist 215 may be formed on a portion of the capping layer 614, and an etching process may be performed to remove the unprotected capping layer 614 as was similarly discussed above. In FIG. 6C, the photoresist 215 may be removed by a stripping process or other suitable process. Accordingly, the capping layer 614 remains in the NMOS device 206 side.

The method 500 continues with block 540 in which a first treatment process may be performed. In FIG. 6D, the treatment process 620 may be performed on the patterned capping layer 614. The treatment process 620 may include a plasma process with $O_3$, He, $NH_3$, $H_2$, or $N_2$. The plasma process may include the following process conditions: total pressure ranging from about 1 to about 5 torr (preferably 2 torr), partial pressure ranging from about 0.2 to about 1 torr (preferably 0.5 torr), time period ranging from about 1 to about 10 seconds (preferably 5 seconds), temperature less than about 400 degree C. (preferably 350 degree C.). Alternatively, the treatment process 620 may optionally include a low temperature (less than 400 degree C.) annealing with a gas including $H_2O$, $O_3$, He, $NH_3$, $H_2$, $N_2$, or $SiH_4$.

Figure 6F:
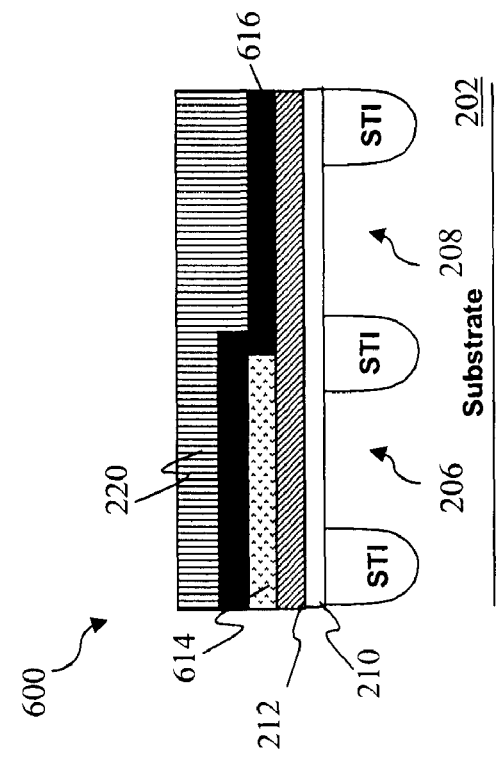
Figure 6E:
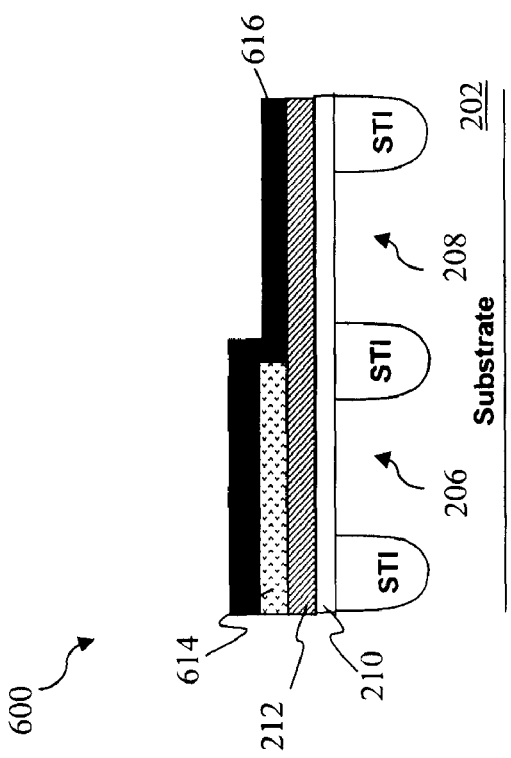

The method 500 continues with block 550 in which a second capping layer may be formed over the first capping layer in the first region and over the high-k dielectric layer in the second region. The semiconductor device 600 may further include a capping layer 616 for tuning a work function (for the gate electrode) for properly performing as an PMOS device 208. In FIG. 6E, for example, a capping layer 616 such as aluminum oxide ($Al_2O_3$) may be formed over the high-k dielectric in the PMOS device 208 side and over the capping layer 614 in the NMOS device 206 side. The capping layer 616 may include a thickness less than 10 angstrom (A). It should be noted that the capping layer 614 in the NMOS device 206 side is formed of a stronger effective work function tuning material as compared to the capping layer 616. That is, the capping layer 614 is still able to tune the effective work function in the NMOS device 206 even though the capping layer 616 is formed over the capping layer 614 in the NMOS device 206 side. Further, it should be noted that the treatment processes 620 (block 540) before the metal deposition may repair the damage caused by the patterning process of the capping layer 614. Accordingly, the dimension dependence of various performance characteristics may be reduced and the gate-capacitance may not worsen.

The method 500 continues with block 560 in which a metal layer may be formed over the second capping layer. In FIG. 6F, a metal layer 220 may be formed over the capping layer 616. The metal layer 220 may include any metal material suitable for forming a metal gate or portion thereof, including work function layers, liner layers, interface layers, seed layers, adhesion layers, barrier layers, etc. The metal layer 220 may include various metals such as TiN, TiAlN, TaN, TaC, WN, Al, or other suitable metals. The metal layer 220 may have a thickness ranging from 20 to about 200 angstrom (A). The metal layer 220 may be formed by various deposition techniques such as CVD, PVD or sputtering, plating, or other suitable technique.

The method 500 continues with block 570 in which a first gate stack may be formed in a first region and a second gate stack may be formed in the second region. The process implemented for block 570 is similar to the process discussed in block 160 of FIG. 1. Thereafter, it is understood the semiconductor device 600 may continue with CMOS process flow to form various structures such as lightly doped drain regions (LDD), sidewall spacers on the gate stacks, source/drain regions, silicide features, contact etch stop layers (CESL), inter-layer dielectric (ILD), contact/vias, interconnect layers, metal layers, dielectric layers, passivation layer and so forth. Although the example above was disclosed as being fabricated in a gate first process, the method 500 may be implemented in a gate last process and also a hybrid process that includes a gate first process and a gate last process.

Figure 7:
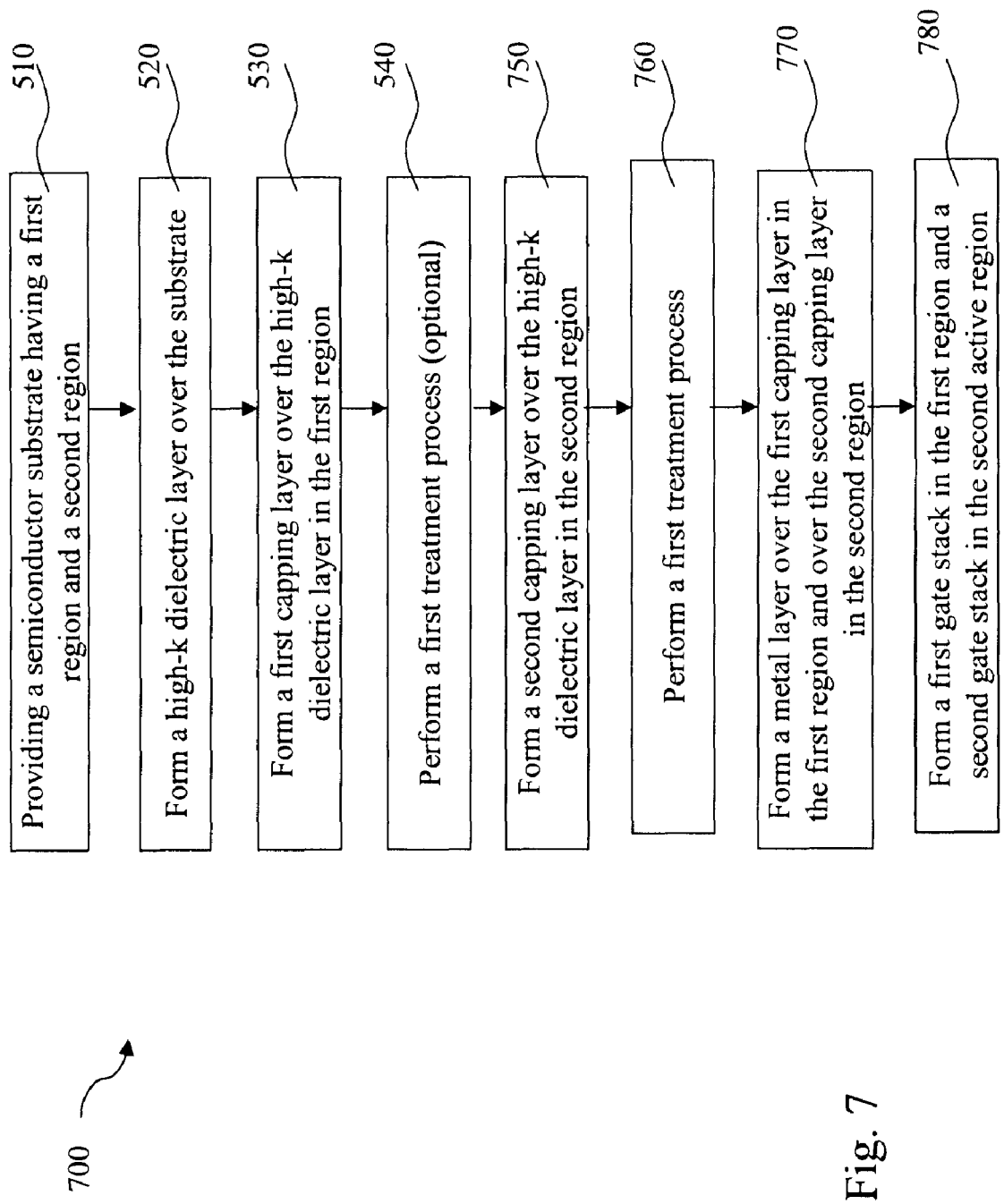
FIG. 7 is a flowchart of yet another alternative method for fabricating a semiconductor device having a high-k dielectric and metal gate according to various aspects of the present disclosure.

Referring to FIG. 7, illustrated is a flowchart of yet another alternative method 700 for fabricating a semiconductor device having a high-k dielectric and metal gate according to various aspects of the present disclosure. Referring also to FIGS. 8A to 8F, illustrated are cross-sectional views of a semiconductor device 800 at various stages of fabrication according to the method 700 of FIG. 7. FIGS. 8A to 8F have been simplified to emphasize gate structures of an NMOS device and PMOS device, respectively, for a better understanding of the inventive concepts of the present embodiment. The method 700 is similar to the method 500 of FIG. 5 and the semiconductor device 800 is similar to the semiconductor device 600 of FIG. 6. Accordingly, similar process blocks in FIGS. 5 and 7 and similar features in FIGS. 6 and 8 are numbered the same for the sake of simplicity and clarity.

Figures 8A, 8B:
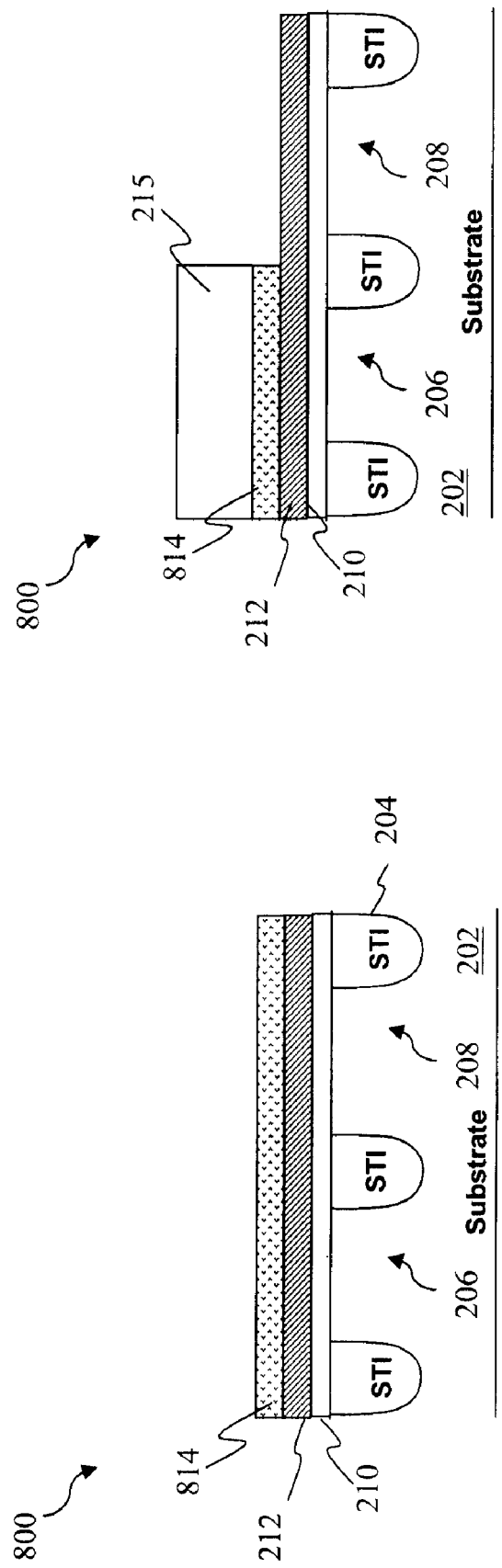
FIGS. 8A to 8F are cross-sectional views of a semiconductor device at various stages of fabrication according to the method of FIG. 7.

The method 700 begins with block 510 in which a semiconductor substrate having a first region and a second region may be provided. In FIG. 8A, the semiconductor device 800 may include a semiconductor substrate 202 such as a silicon substrate. The substrate 202 may alternatively include silicon germanium, gallium arsenic, or other suitable semiconductor materials. The substrate 202 may further include other features such as various doped regions such as a p-well or n-well, a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 800 may further include an isolation structure 204 such as a shallow trench isolation (STI) feature formed in the substrate 202 for isolating active regions 206 and 208 in the substrate. The isolation structure 204 may be formed of silicon oxide, silicon nitride, silicon oxynitride, fluoride-doped silicate (FSG), and/or a low k dielectric material known in the art. The active region 206 may be configured as an NMOS transistor device and the active region 208 may be configured as a PMOS transistor device.

The semiconductor device 800 may further include an interfacial layer 210 formed on the substrate 202. The interfacial layer 210 may include a silicon oxide layer having a thickness ranging from about 5 to about 10 angstrom (A). The method 700 continues with block 520 in which a high-k dielectric layer may be formed over the substrate. The semiconductor device 800 may further include a high-k dielectric layer 212 formed on the interfacial layer 210. The high-k dielectric layer 212 may be formed by ALD, CVD, PVD, or other suitable technique. The high-k dielectric layer 212 may include a thickness ranging from about 10 to about 30 angstrom (A). The high-k dielectric layer 212 may include hafnium oxide ($HfO_2$). Alternatively, the high-k dielectric layer 212 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

The method 700 continues with block 530 in which a first capping layer may be formed over the high-k dielectric layer in the first region. The semiconductor device 800 may further include a capping layer for tuning a work function (for the gate electrode) for properly performing as an NMOS device 206. For example, a capping layer 814 such as lanthanum oxide ($LaO_x$) may be formed in the NMOS device 206. Alternatively, the capping layer 814 may optionally include an oxide containing Dy, Sc, Yb, Er, or Gd. The capping layer 814 may include a thickness ranging from about 3 to about 20 angstrom (A). In FIG. 8B, the capping layer 814 may be patterned by a photolithography process and etching process to remove the capping layer 814 in the PMOS device 208. For example, a patterned photoresist 215 may be formed on a portion of the capping layer 814, and an etching process may be performed to remove the unprotected capping layer 814 as was similarly discussed above. It is understood that a capping layer such as aluminum oxide or titanium oxide may be first formed in the PMOS device 208 instead of the NMOS device 206 by a similar process. The photoresist 215 may be removed by a stripping process or other suitable process. Accordingly, the capping layer 814 remains in the NMOS device 206 side.

The method 700 continues with block 540 in which a first treatment process may be performed. The first treatment is similar to the treatment process 620 discussed in FIG. 6D. As previously discussed, the treatment process 620 may repair the damage caused by the patterning process of the capping layer 814. It should be noted that this first treatment may be omitted in some embodiments.

Figure 8C:
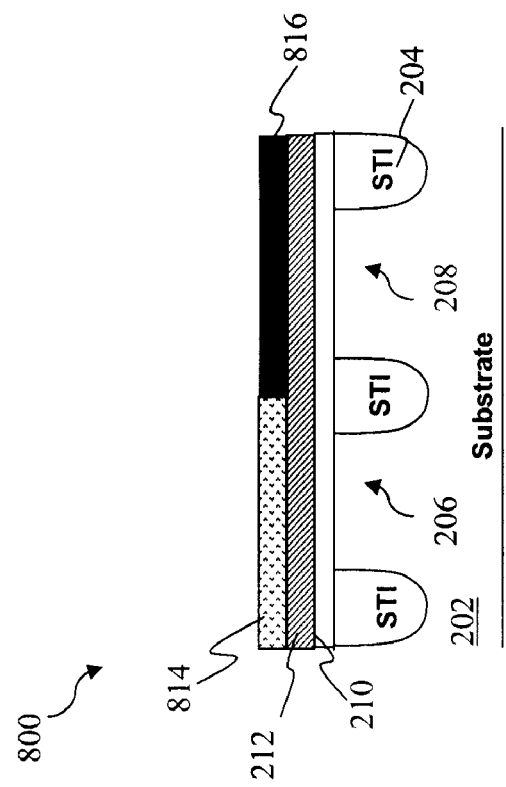
Figure 8D:
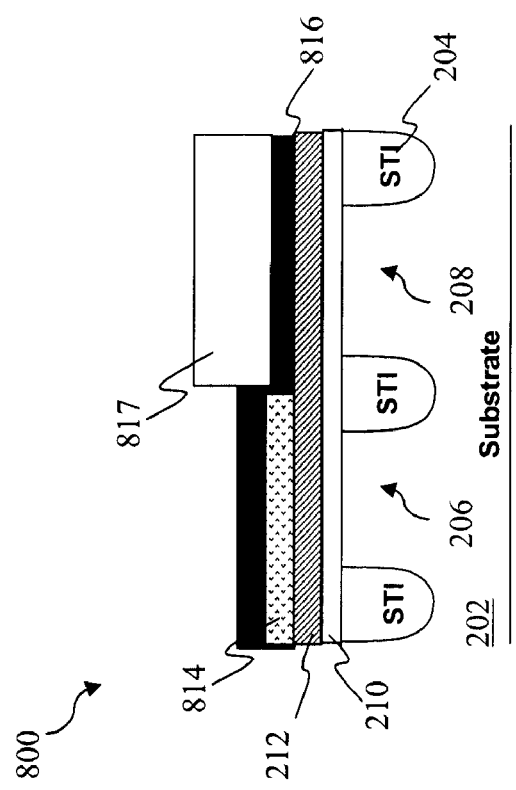

The method continues with block 750 in which a second capping layer may be formed over the high-k dielectric layer in the second region. A capping layer 216 such as aluminum oxide ($Al_2O_3$) may be formed in the PMOS device 208 side. In FIG. 8C, the capping layer 816 may be formed over the capping layer 814 in the NMOS device side 206 and over the high-k dielectric 212 in the PMOS device side 208. The capping layer 816 may include a thickness ranging from about 3 to about 20 angstrom (A). The capping layer 816 may be removed in the NMOS device 206 side by forming a patterned photoresist 817 to protect the capping layer 816 in the PMOS device 208 side, and then performing a wet etching or dry etching or combination dry and wet etching process to remove the unprotected capping layer 816. Alternatively, a hard mask may optionally be used to protect the capping layer 816 in the PMOS device 208 side instead of the photoresist 817. In FIG. 8D, the photoresist 817 may be removed by a stripping process or other suitable process. Accordingly, the capping layer 816 remains in the PMOS device 208 side. Alternatively, the capping layer 816 may optionally include an oxide containing titanium (Ti). It should be noted that the high-k dielectric 212 and capping layers 814, 816 disclosed above are mere examples and that other configurations may also be used.

Figure 8F:
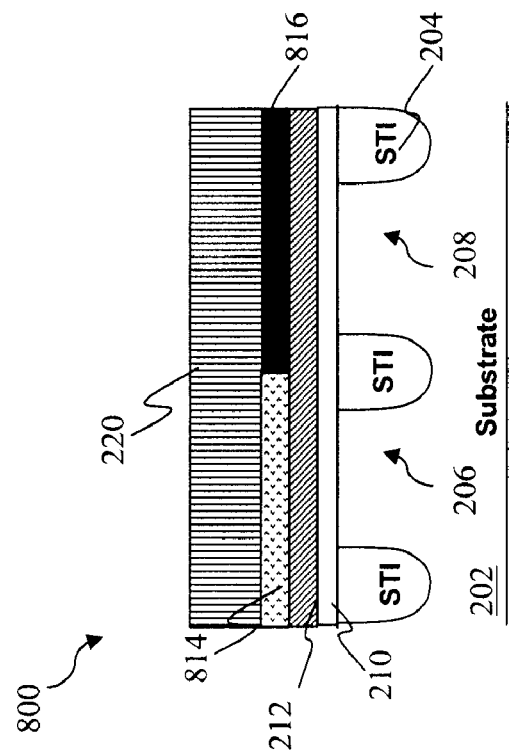
Figure 8E:
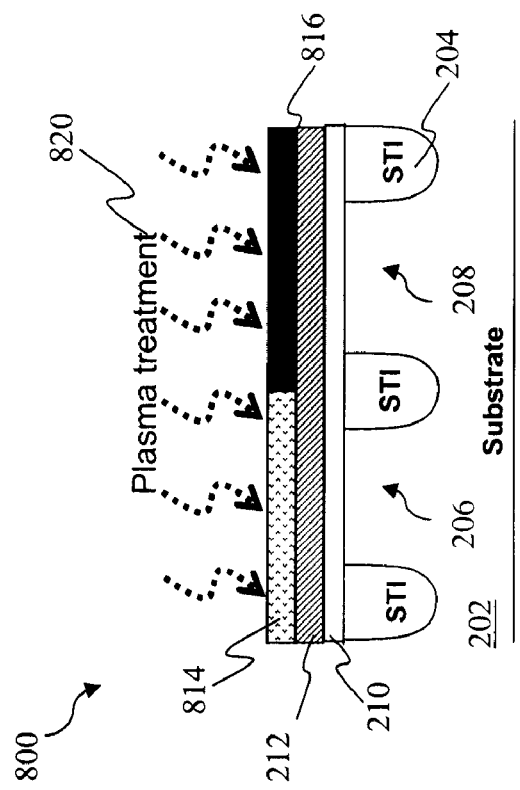

The method 700 continues with block 760 in which a second treatment process may be performed. In FIG. 8E, the treatment process 820 may be performed on the capping layers 814, 816. The treatment process 820 may be similar to the treatment process 620 discussed in FIG. 6D.

The method 700 continues with block 770 in which a metal layer may be formed over the first capping layer in the first region and over the second capping layer in the second region. In FIG. 8F, the semiconductor device 800 may further include a metal layer 220 formed over the capping layer 814 in the NMOS device 206 side and over the capping layer 816 in the PMOS device 208 side. The metal layer 220 may include any metal material suitable for forming a metal gate or portion thereof, including work function layers, liner layers, interface layers, seed layers, adhesion layers, barrier layers, etc. The metal layer 220 may include various metals such as TiN, TiAlN, TaN, TaC, WN, Al, or other suitable metals. The metal layer 220 may have a thickness ranging from 20 to about 200 angstrom (A). The metal layer 220 may be formed by various deposition techniques such as CVD, PVD or sputtering, plating, or other suitable technique.

The method 700 continues with block 780 in which a first gate stack may be formed in a first region and a second gate stack may be formed in the second region. The process implemented for block 780 is similar to the process discussed in block 160 of FIG. 1. Thereafter, it is understood the semiconductor device 800 may continue with CMOS process flow to form various structures such as lightly doped drain regions (LDD), sidewall spacers on the gate stacks, source/drain regions, silicide features, contact etch stop layers (CESL), inter-layer dielectric (ILD), contact/vias, interconnect layers, metal layers, dielectric layers, passivation layer and so forth. Although the example above was disclosed as being fabricated in a gate first process, the method 700 may be implemented in a gate last process and also a hybrid process that includes a gate first process and a gate last process. Further, it should be noted that the treatment processes 620 and 820 (blocks 540 and 760) before the metal deposition may repair the damage caused by the patterning process of the capping layers 814, 816. Accordingly, the dimension dependence of various performance characteristics may be reduced and the gate-capacitance may not worsen.

Figure 9:
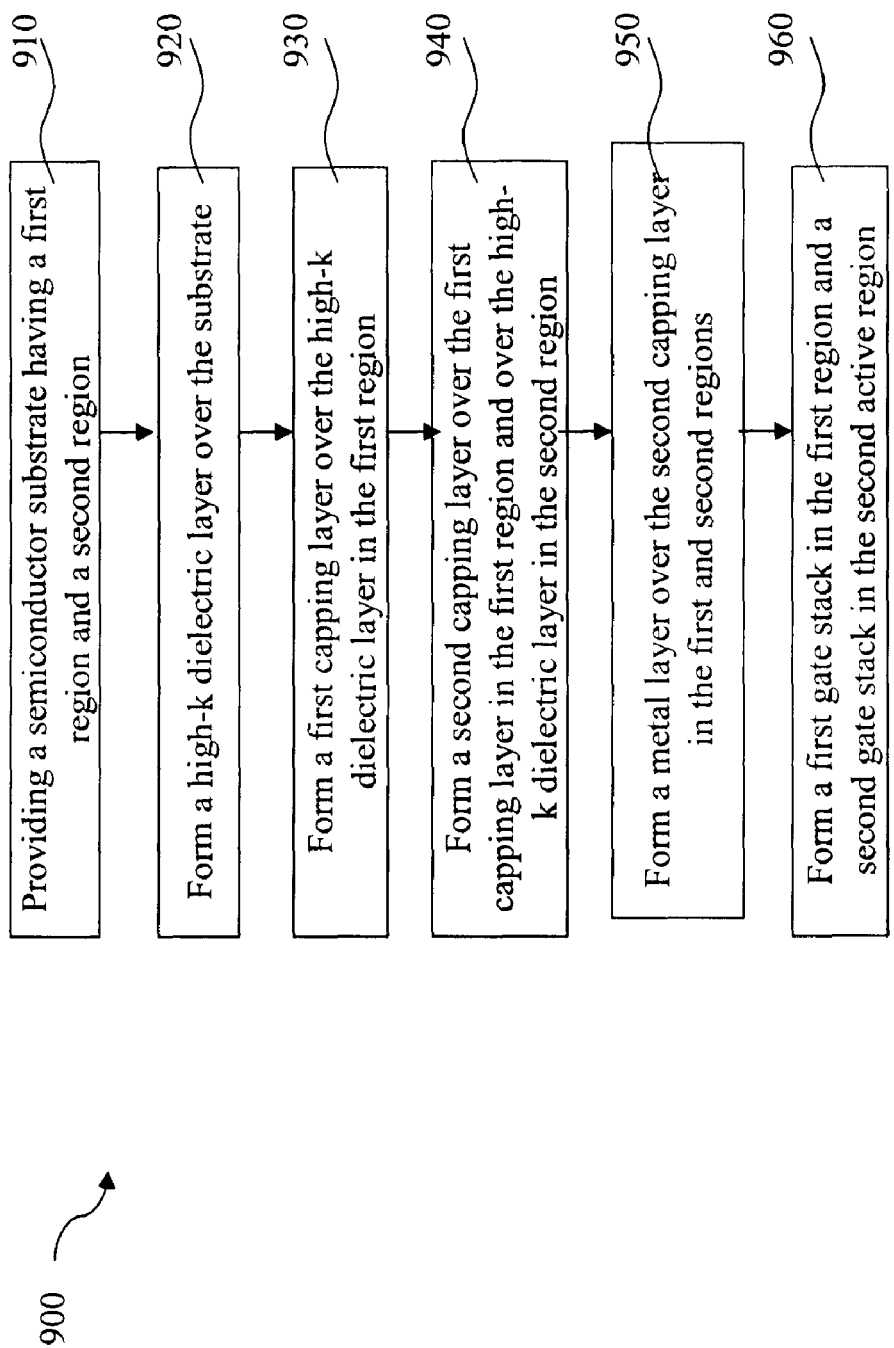
FIG. 9 is a flowchart of still another alternative method for fabricating a semiconductor device having a high-k dielectric and metal gate according to various aspects of the present disclosure.

Referring to FIG. 9, illustrated is a flowchart of sill another alternative method 900 for fabricating a semiconductor device having a high-k dielectric and metal gate according to various aspects of the present disclosure. Referring also to FIGS. 10A to 10E, illustrated are cross-sectional views of a semiconductor device 1000 at various stages of fabrication according to the method 900 of FIG. 9. FIGS. 10A to 10E have been simplified to emphasize gate structures of an NMOS device and PMOS device, respectively, for a better understanding of the inventive concepts of the present embodiment. The semiconductor device 1000 may be similar to the semiconductor device 200 of FIG. 2. Similar features in FIGS. 2 and 10 are numbered the same for the sake of simplicity and clarity.

Figure 10B:
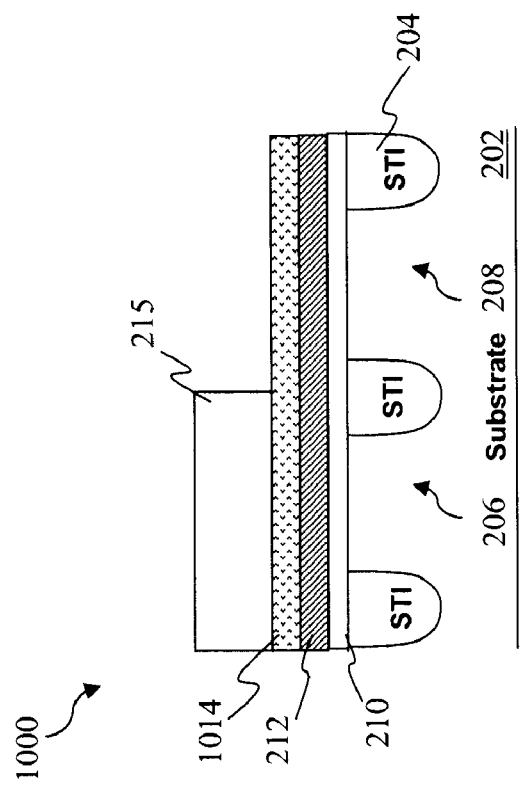
FIGS. 10A to 10E are cross-sectional views of a semiconductor device at various stages of fabrication according to the method of FIG. 9.
Figure 10A:
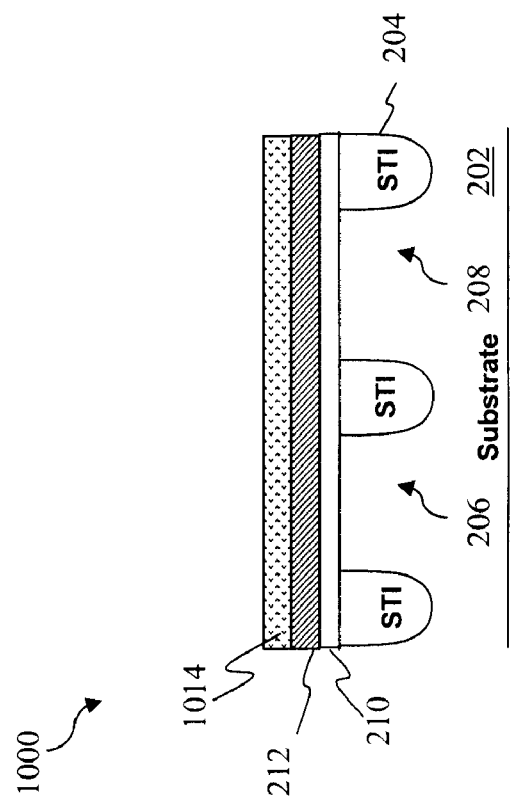

The method 900 begins with block 910 in which a semiconductor substrate having a first region and a second region may be provided. In FIG. 10A, the semiconductor device 1000 may include a semiconductor substrate 202 such as a silicon substrate. The substrate 202 may alternatively include silicon germanium, gallium arsenic, or other suitable semiconductor materials. The substrate 202 may further include other features such as various doped regions such as a p-well or n-well, a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 1000 may further include an isolation structure 204 such as a shallow trench isolation (STI) feature formed in the substrate 202 for isolating active regions 206 and 208 in the substrate. The isolation structure 204 may be formed of silicon oxide, silicon nitride, silicon oxynitride, fluoride-doped silicate (FSG), and/or a low k dielectric material known in the art. The active region 206 may be configured as an NMOS transistor device and the active region 208 may be configured as a PMOS transistor device.

The semiconductor device 1000 may further include an interfacial layer 210 formed on the substrate 202. The interfacial layer may include a silicon oxide layer having a thickness ranging from about 5 to about 10 angstrom (A). The method 900 continues with block 920 in which a high-k dielectric layer may be formed over the substrate. The semiconductor device 1000 may further include a high-k dielectric layer 212 formed on the interfacial layer 210. The high-k dielectric layer 212 may be formed by atomic layer deposition (ALD), CVD, or other suitable technique. The high-k dielectric layer 212 may include a thickness ranging from about 10 to about 30 angstrom (A). The high-k dielectric layer 212 may include hafnium oxide ($HfO_2$). Alternatively, the high-k dielectric layer 212 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

Figure 10D:
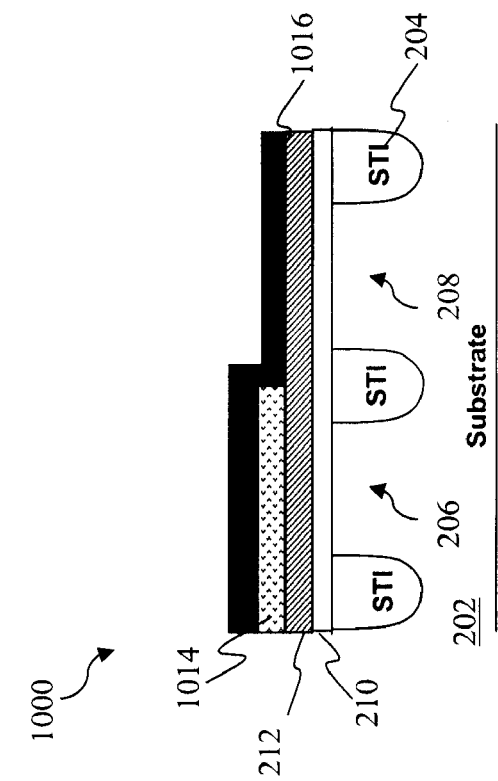
Figure 10C:
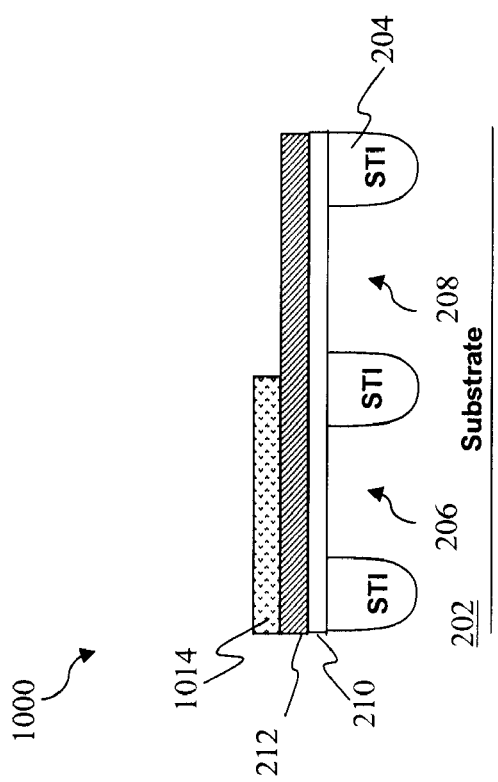

The method 900 continues with block 930 in which a first capping layer may be formed over the high-k dielectric layer in the first region. The semiconductor device 1000 may further include a capping layer for tuning a work function (for the gate electrode) for properly performing as an NMOS device 206. For example, a capping layer 1014 such as lanthanum oxide (LaO$_x$) may be formed in the NMOS device 206. Alternatively, the capping layer 1014 may optionally include an oxide containing Dy, Sc, Yb, Er, or Gd. The capping layer 1014 may include a thickness ranging from about 3 to about 20 angstrom (A). In FIG. 10B, the capping layer 1014 may be patterned by a photolithography process and etching process to remove the capping layer 1014 in the PMOS device 208 side. For example, a patterned photoresist 215 may be formed on a portion of the capping layer 1014, and an etching process may be performed to remove the unprotected capping layer 1014 as was discussed above. In FIG. 10C, the photoresist 215 may be removed by a stripping process or other suitable process. Accordingly, the capping layer 1014 remains in the NMOS device 206 side.

The method 900 continues with block 940 in which a second capping layer may be formed over the first capping layer in the first region and over the high-k dielectric layer in the second region. In FIG. 10D, the semiconductor device 1000 may further include a capping layer for tuning a work function (for the gate electrode) for properly performing as an PMOS device 208. For example, a capping layer 1016 such as aluminum oxide (Al$_2$O$_3$) may be formed over the high-k dielectric layer 212 in the PMOS device 208 side as well as over the capping layer 814 in the NMOS device 206 side. Alternatively, the capping layer 1016 may optionally include an oxide containing titanium (Ti). The capping layer 1016 may include a thickness less than about 10 angstrom (A). It should be noted that the capping layer 1016 is not patterned in this embodiment.

Figure 10E:
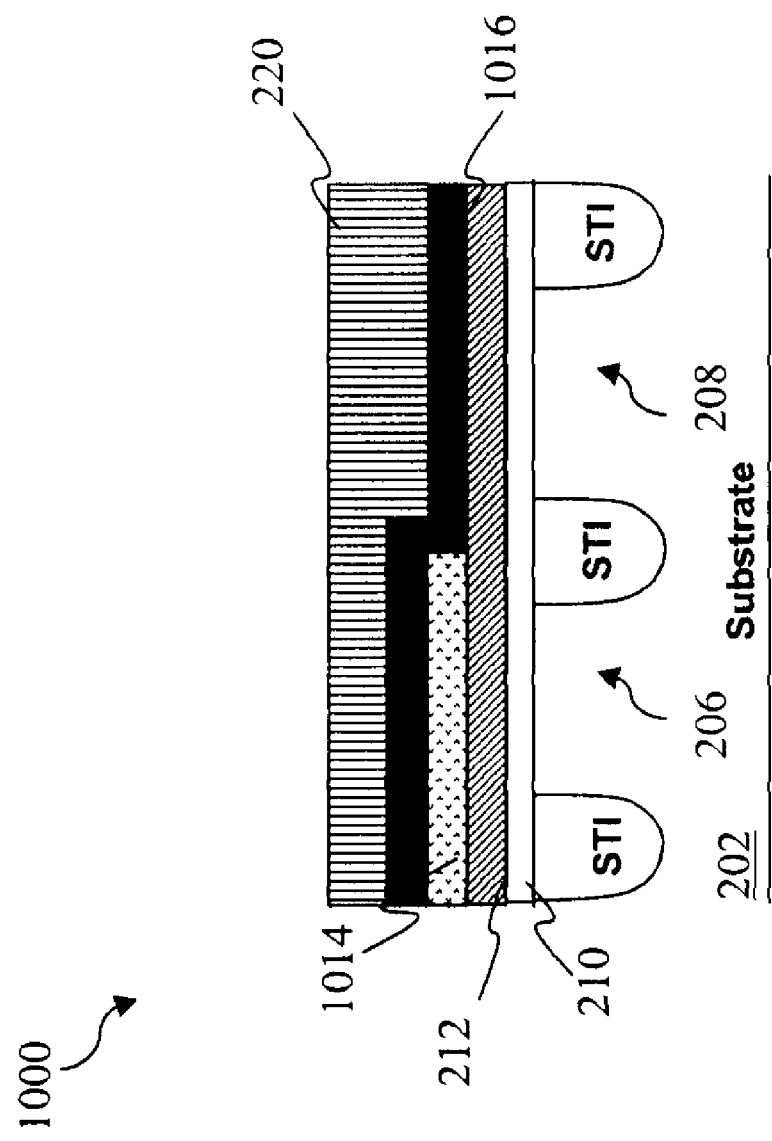

The method 900 continues with block 950 in which a metal layer may be formed over the second capping layer. In FIG. 10E, the semiconductor device 1000 may further include a metal layer 220 formed over the capping layer 1016 in the NMOS device 206 side and in the PMOS device 208 side. The metal layer 220 may include any metal material suitable for forming a metal gate or portion thereof, including work function layers, liner layers, interface layers, seed layers, adhesion layers, barrier layers, etc. The metal layer 220 may include various metals such as TiN, TiAlN, TaN, TaC, WN, Al, or other suitable metals. The metal layer 220 may have a thickness ranging from 20 to about 200 angstrom (A). The metal layer 220 may be formed by various deposition techniques such as chemical vapor deposition (CVD), physical vapor deposition (PVD or sputtering), plating, or other suitable technique.

The method 900 continues with block 960 in which a first gate stack may be formed in a first region and a second gate stack may be formed in the second region. The process implemented for block 960 is similar to the process discussed in block 160 of FIG. 1. Thereafter, it is understood the semiconductor device 1000 may continue with CMOS process flow to form various structures such as lightly doped drain regions (LDD), sidewall spacers on the gate stacks, source/drain regions, silicide features, contact etch stop layers (CESL), inter-layer dielectric (ILD), contact/vias, interconnect layers, metal layers, dielectric layers, passivation layer and so forth. Although the example above was disclosed as being fabricated in a gate first process, the method 900 may be implemented in a gate last process and also a hybrid process that includes a gate first process and a gate last process. Further, it should be noted that the capping layer 1014 in the NMOS device 206 is formed of a strong effective work function tuning material as compared to the capping layer 1016. That is, the capping layer 1014 is still able to tune the effective work function in the NMOS device 206 even though the capping layer 1016 is formed in the NMOS device 206. Further, the capping layer 1016 may be able to tune the effective work function in the PMOS device 208. Also, the cost of production is reduced since there is one less patterning/etching process (e.g., one less photomask). Additionally, the gate leakage current and reliability may be improved without Tinv increment. Further, the dimension dependence of various performance characteristics may be reduced and the gate-capacitance may not worsen.

The present invention achieves different advantages in various embodiments disclosed herein. For example, the present disclosed method provides a simple and cost-effective method for improving a dielectric quality of a high-k gate dielectric in a CMOS process flow. Accordingly, the integrity of the high-k gate dielectric may be maintained throughout semiconductor processing. The methods and devices disclosed herein may easily be integrated with current CMOS technology processing and semiconductor equipment. Further, the methods and devices disclosed herein lessen the dimension dependence of device performance characteristics such as threshold voltage, drive-current, and off-current.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the treatment process of FIGS. 3, 5, and 7 may be performed following the patterning process of FIGS. 1 and 9. Also, the Si containing layer may be incorporated in the semiconductor devices 400, 600, 800, and 1000 of FIGS. 4, 6, 8, and 10, respectively. Moreover, the embodiments disclosed herein may be implemented in a gate firs process, a gate last process, and a hybrid process including a gate first process and gate last process.

What is claimed is:

1. A method of fabricating a semiconductor device comprising:
   providing a semiconductor substrate having a first region and a second region;
   forming a high-k dielectric layer over the semiconductor substrate;
   forming a first capping layer over the high-k dielectric layer, the first capping layer overlying the first region;
   forming a second capping layer over the high-k dielectric layer after forming the first capping layer, the second capping layer overlying the second region;
   forming a layer containing silicon (Si) over the first and second capping layers;
   forming a metal layer over the layer containing Si; and
   forming a first gate stack over the first region and a second gate stack over the second active region;
   wherein the first gate stack includes the high-k dielectric layer, the first capping layer, the layer containing Si, and the metal layer,
   wherein the second gate stack includes the high-k dielectric layer, the second capping layer, the layer containing Si, and the metal layer, and
   wherein the forming the first capping layer includes:
     forming the first capping layer over the first and second regions;

removing the first capping layer overlying the second region by a patterning and etching process;
wherein the forming the second capping layer includes:
forming the second capping layer over the first and second regions; and
removing the second capping layer overlying the first region by a patterning and etching process.

2. The method of claim 1, further comprising performing a plasma treatment or an annealing treatment after etching the first capping layer and the second capping layer.

3. The method of claim 2, wherein the plasma treatment includes $O_3$, He, $NH_3$, $H_2$, or $N_2$.

4. The method of claim 2, wherein the annealing treatment includes a low temperature annealing with a temperature less than 400° C. and a gas including $H_2O$, $O_3$, He, $NH_3$, $H_2$, $N_2$, or $SiH_4$.

5. The method of claim 1, wherein the first capping layer includes lanthanum oxide and the second capping layer includes aluminum oxide.

6. The method of claim 1, wherein the layer containing Si includes a thickness less than about 5 angstrom (A).

7. The method of claim 1, wherein the layer containing Si the layer includes a silicon layer, a silicon oxide layer, or a Si-rich silicon oxide layer.

8. A method of fabricating a semiconductor device comprising:
providing a semiconductor substrate having a first region and a second region;
forming a high-k dielectric layer over the semiconductor substrate;
forming a first capping layer over the high-k dielectric layer;
etching the first capping layer overlying the second region to completely remove the first capping layer overlying the second region thereby exposing an upper surface of the high-k dielectric layer overlying the second region;
performing a first treatment process, the first treatment process including a plasma process or an annealing process;
forming a metal layer over the first capping layer overlying the first region and on the exposed upper surface of the high-k dielectric layer overlying the second region; and
forming a first gate stack over the first region and a second gate stack over the second region;
wherein the first gate stack includes the high-k dielectric layer, the first capping layer, and the metal layer;
wherein the second gate stack includes the high-k dielectric layer and the metal layer.

9. The method of claim 8, further comprising after performing the first treatment process:
forming a second capping layer on the first capping layer overlying the first region and on the high-k dielectric layer overlying the second region, the second capping layer being different from the first capping layer;
wherein the metal layer is formed on the second capping layer; and
wherein the first and second gate stacks each further includes the second capping layer.

10. The method of claim 9, wherein the second capping layer includes a thickness less than 10 angstrom (A).

11. The method of claim 8, further comprising after performing the first treatment process:
forming a second capping layer on the first capping layer overlying the first region and on the high-k dielectric layer overlying the second region, the second capping layer being different from the first capping layer;
etching the second capping layer overlying the first region; and
performing a second treatment process, the second treatment process including the plasma process or the annealing process;
wherein the metal layer is formed on the first capping layer overlying the first region and on the second capping layer overlying the second region;
wherein the second gate stack further includes the second capping layer.

12. The method of claim 11, wherein the plasma process includes $O_3$, He, $NH_3$, $H_2$, or $N_2$.

13. The method of claim 11, wherein the annealing process includes a low temperature annealing with a temperature less than 400° C. and a gas including $H_2O$, $O_3$, He, $NH_3$, $H_2$, $N_2$, or $SiH_4$.

14. A semiconductor device comprising:
a semiconductor substrate having a first region and a second region;
a first transistor formed in the first region, the first transistor having a first gate stack that includes:
an interfacial layer formed over the semiconductor substrate;
a high-k dielectric layer formed over the interfacial layer;
a first capping layer formed over the high-k dielectric layer;
a layer containing silicon (Si) formed over the first capping layer; and
a metal layer formed over the layer containing Si; and
a second transistor formed in the second region, the second transistor having a second gate stack that includes:
the interfacial layer formed over the semiconductor substrate;
the high-k dielectric layer formed over the interfacial layer;
a second capping layer formed over the high-k dielectric layer, the second capping layer being different from the first capping layer;
the layer containing (Si) formed over the second capping layer; and
the metal layer formed over the layer containing Si.

15. The semiconductor device of claim 14, wherein the layer containing silicon includes a silicon layer, a silicon oxide layer, or a Si-rich silicon oxide layer.

16. The semiconductor device of claim 14, wherein the first capping layer includes an oxide containing La, Dy, Sc, Yb, Er, or Gd and wherein the second capping layer includes an oxide containing Al or Ti.

17. The semiconductor device of claim 14, wherein the first transistor is an NMOS transistor and wherein the second transistor is a PMOS transistor.

18. The semiconductor device of claim 14, where the first capping layer is formed of a first material and the second capping layer is formed of a second material, the first material being different than the second material.

19. The semiconductor device of claim 14, wherein the layer containing Si has a thickness less than 5 angstrom (A).

20. The semiconductor device of claim 14, wherein the layer containing silicon (Si) is formed on and in physical contact with the first capping layer.

21. The method of claim 1, wherein the second capping layer is different from the first capping layer.

* * * * *